(12) United States Patent  
Iriguchi

(10) Patent No.: US 7,643,188 B2  
(45) Date of Patent: Jan. 5, 2010

(54) METHOD OF RECORDING AN EXPOSURE PATTERN IN A RECORDING LAYER OF A HOLOGRAPHIC MASK, METHOD OF FORMING AN EXPOSURE PATTERN IN A PHOTOSENSITIVE MATERIAL FILM, METHOD OF MANUFACTURING A SEMICONDUCTOR DEVICE AND METHOD OF MANUFACTURING AN ELECTRO-OPTIC DEVICE

(75) Inventor: Chiharu Iriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 329 days.

(21) Appl. No.: 11/691,836

(22) Filed: Mar. 27, 2007

(65) Prior Publication Data

US 2007/0229927 A1   Oct. 4, 2007

(30) Foreign Application Priority Data

Apr. 3, 2006   (JP) ............................. 2006-101656

(51) Int. Cl.
*G03H 1/20* (2006.01)
*G03H 1/04* (2006.01)

(52) U.S. Cl. ............................. 359/12; 359/35; 355/77

(58) Field of Classification Search ................... 359/10, 359/12, 15, 35; 355/53, 67, 77
See application file for complete search history.

(56) References Cited

U.S. PATENT DOCUMENTS 5,504,596 A * 4/1996 Goto et al. .................... 359/24
5,774,240 A * 6/1998 Goto et al. .................... 359/12
2003/0039896 A1* 2/2003 Iriguchi ......................... 430/5

FOREIGN PATENT DOCUMENTS

WO   WO03/010803 A1   2/2003

OTHER PUBLICATIONS

Clube, Francis et al. "0.5 μm Enabling Lithography for Low-Tempearture Polysilicon Displays," SID 2003 Digest, pp. 350-353 (2003).

* cited by examiner

*Primary Examiner*—Alessandro Amari
(74) *Attorney, Agent, or Firm*—Oliff & Berridge, PLC

(57) ABSTRACT

A method of recording an exposure pattern in a recording layer of a holographic mask, using an original reticle that has the exposure pattern formed therein, the recording method comprising: illuminating a first recording light and a first reference light to the recording layer simultaneously, the first recording light being illuminated through an original reticle placed opposite to the holographic mask with a first gap therebetween, the first reference light being illuminated to the recording layer at a first incident angle; and illuminating a second recording light and a second reference light to the recording layer simultaneously, the second recording light being illuminated through the original reticle placed opposite to the holographic mask with a second gap therebetween, the second gap being different from the first gap, the second reference light being illuminated to the recording layer at a second incident angle.

10 Claims, 9 Drawing Sheets

METHOD OF RECORDING AN EXPOSURE PATTERN IN A RECORDING LAYER OF A HOLOGRAPHIC MASK, METHOD OF FORMING AN EXPOSURE PATTERN IN A PHOTOSENSITIVE MATERIAL FILM, METHOD OF MANUFACTURING A SEMICONDUCTOR DEVICE AND METHOD OF MANUFACTURING AN ELECTRO-OPTIC DEVICE

BACKGROUND OF THE INVENTION

1. Technical Field

Several aspects of the present invention relate to a recording method for recording a desired exposure pattern in a holographic mask having a recording layer, a holographic exposure method for exposing a photosensitive material film on a substrate to light by using the holographic mask so that a desired exposure pattern is printed on the photosensitive material film, a method for manufacturing a semiconductor device and a method for manufacturing an electro-optic device.

2. Related Art

In photolithography technologies to form an electric circuit or element on a substrate such as a wafer for use in a semiconductor device and the like, attention has been focused on a holographic exposure method that allows a fine pattern to be printed.

The holographic exposure method is a method in which a recording layer of a holographic mask is illuminated with a light beam for reconstruction and the diffracted light is caused by an interference pattern that has been recorded in advance as a hologram in the recording layer.

A photosensitive material film on a substrate is exposed to the diffracted light so that a desired exposure pattern is printed onto the film.

The method is described in "0.05 μm Enabling Lithography for Low-Temperature Polysilicon Displays" SID 2003 Digest, pages 350-353.

The foregoing holographic exposure method has higher resolution than general exposure methods that use lens optical systems.

On the other hand, the foregoing method has such characteristics that the numerical aperture is less adjustable and the focal depth is smaller than the lens optical systems.

Therefore, the method has a problem in that if a device such as a semiconductor device is formed on a surface of a substrate, exposure need be performed a plurality of times (multiple exposure) with the gap between a holographic mask and the substrate being changed to be adapted for unevenness of the surface, that is unevenness of a photosensitive material film.

In order to solve this problem, various devices have been known in related art.

These devices include an exposure device including a light source that irradiates a film to be exposed on a substrate with exposure light, a positioning mechanism that positions an exposure master plate in the optical path of the exposure light, a driving mechanism that controls the distance between the exposure master plate and the film to be exposed, and a scanning mechanism that changes the position of the exposure light relative to the film to be exposed (WO03/010803, pages 4 and 13, FIG. 8).

In the foregoing exposure device, a distance measurement device that measures the distance between the exposure master plane and the film to be exposed is included, and based on the measured result by this distance measurement device, the driving mechanism controls the distance between the exposure master plane and the film to be exposed.

More specifically, in the exposure process, the exposure light is emitted so as to scan the film to be exposed through the exposure master plate.

In synchronization with this scan, the driving mechanism controls the gap between the exposure master plate and the film to be exposed to have a desired distance by moving a stage with a substrate mounted thereon in the Z-axis direction.

Therefore, exposure is performed with the focal position of exposure light being periodically changed in accordance with changes of the height of the surface of the film to be exposed.

This is intended to overcome the small focal depth, one of the problems in the holographic exposure method.

In methods using the foregoing exposure device of related art, if the substrate to be exposed is made larger in size, the stage is also required to be larger in size.

With the size increasing, the inertial mass of the stage increases.

As a result, errors are likely to be greater in periodically controlling the focal point of exposure light by the foregoing driving mechanism.

Thus, there exists a problem in that the focal position of the exposure light does not follow unevenness of the surface of the film to be exposed and undulations of the substrate, so that part of the substrate to be exposed might remain unexposed to light.

Further, regarding the case where relatively high resolution is not required but a large focal depth is desired, a technique of easily adjusting the focal depth has not been developed in the holographic exposure method using a holographic mask.

SUMMARY

An advantage of the present invention is to provide a recording method in which the focal depth during holographic exposure is easily adjustable without the necessity of devising the configuration of a holographic exposure device and the like, a method for manufacturing a semiconductor device and a method for manufacturing an electro-optic device.

According to a first aspect of the invention, using an original reticle having an exposure pattern formed therein and a holographic mask having a recording layer, a recording method for holographically recording the exposure pattern in the recording layer includes: (a) with the original reticle and the holographic mask placed opposite to each other with a predetermined gap therebetween, illuminating recording light through the original reticle to the recording layer while simultaneously illuminating reference light to the recording layer at a predetermined incident angle from a side of the holographic mask; and (b) with the original reticle and the holographic mask placed opposite to each other with a gap different from the predetermined gap, illuminating recording light through the original reticle to the recording layer while simultaneously illuminating reference light to the recording layer at a predetermined angle from the side of the holographic mask.

According to this method, in the step (b), the pattern is holographically recorded in the recording layer with a gap between the original reticle and the holographic mask different from the predetermined gap that is used in the step (a).

Therefore, by the steps (a) and (b), the exposure pattern of the original reticle is multiply recorded in the recording layer of the holographic mask as the interference pattern caused by interference of the recording light and the reference light.

By using the holographic mask with the pattern multiply recorded, holographic exposure in which exposure light is illuminated from the reversed direction to the incident direction of the reference light is performed with the above-mentioned predetermined gap between the holographic mask and an object to be exposed.

As a result, a reconstruction combined wave, which is a high-order diffracted wave, occurs due to the interference pattern multiply recorded.

Thus, as compared to the case where a holographic mask with the pattern recorded only by the step (a), the reconstruction combined wave includes a diffracted wave caused by the interference pattern recorded in the step (a) and a diffracted wave caused by the interference pattern recorded in the step (b), and is a combined wave having the amplitude (light intensity) attenuated by the interference of these diffracted waves.

The numerical aperture during holographic exposure is dependent on this amplitude.

Therefore, multiply recording the pattern in the holographic mask enables adjustment of the numerical aperture to be smaller than its inherent value.

The focal depth during holographic exposure is inversely proportional to the square of the numerical aperture.

Accordingly, the smaller the numerical aperture is, the larger the focal depth will be.

Consequently, it is possible to provide a recording method in which the focal depth during holographic exposure is easily adjustable without the necessity of devising the configuration of a holographic exposure device and the like.

Note that the reference light has a wavelength and a light intensity that allow the interference with the recording light diffracted by the exposure pattern of the original reticle to occur.

It is preferable that the above step (b) include (c) with the gap between the original reticle and the holographic mask offset by a predetermined distance in a direction for the gap to expand relative to the predetermined gap, simultaneously illuminating the recording light and the reference light to the recording layer, and (d) with the gap offset by the predetermined distance in a direction for the gap to narrow relative to the predetermined gap, simultaneously illuminating the recording light and the reference light to the recording layer, the steps (c) and (d) each being performed at least one time.

According to this method, in the step (b), holographic recording is performed with the gap between the original reticle and the holographic mask offset by a certain distance in a direction for the gap to expand relative to the predetermined gap and also in a direction for the gap to narrow.

Thus, the exposure pattern is recorded in the recording layer of the holographic mask at least three times with each of gaps that are different from one another at each of the recording times.

If holographic exposure is performed by using the holographic mask with the pattern multiply recorded, the resulting reconstruction combined wave includes a diffracted wave caused by the interference pattern recorded in the step (a), and at least two diffracted waves caused by the interference patterns each recorded with the gap offset by a certain distance in a direction for the gap to expand or in a direction for the gap to narrow.

Therefore, with respect to the former diffracted wave, the latter two diffracted waves each have a certain optical path difference in accordance with the certain offset distance.

Thus, the reconstruction combined wave is attenuated in accordance with the certain optical path difference.

That is, by setting the numerical aperture to be a value in accordance with the above certain distance, the focal depth can be adjusted to be the intended value.

Upon taking a wavelength of the above recording light to be $\lambda$, it is preferable that the predetermined distance for offsetting the gap be $n\lambda$.

This enables the amplitude to be attenuated with the phase of the reconstruction combined wave not reversed on the optical axis.

That is, in the state of the minimum attenuation of the intensity of an optical image when the image is formed, holographic exposure can be performed by controlling the numerical aperture.

Note that n is a natural number greater than or equal to 1.

If the distance between the original reticle and the holographic mask is exceedingly apart from that of the predetermined gap, the light intensity during recording decreases, so that the formed image is likely to be blurred, whereas if the distance is exceedingly close to that of the gap, the image is likely to be affected by errors in alignment accuracy, Therefore, more preferably n=2.

A holographic exposure method according to a second aspect of the invention is one for exposing a photosensitive material film formed on a substrate to light by using a holographic mask as an exposure master plate for a desired exposure pattern to be printed on the photosensitive material film.

The method includes: holographically recording the exposure pattern in the recording layer of the holographic mask with use of the recording method according to the first aspect of the invention, placing the holographic mask and the substrate opposite to each other so as for a gap between the recording layer and a surface of the photosensitive material film being a predetermined gap to bring exposure light to focus on the photosensitive material film, and illuminating exposure light through the holographic mask so as to scan an exposure area of the photosensitive material film.

According to this method, in the process of recording the exposure pattern, the exposure pattern of the original reticle is multiply recorded in the recording layer of the holographic mask with use of the recording method according to the first aspect of the invention.

Therefore, in the process of illuminating exposure light, it is possible to expose the photosensitive material film to a reconstruction combined wave with the focal depth adjusted in accordance with the resolution of the exposure pattern of the original reticle during the holographic exposure.

In other words, it is possible to provide a holographic exposure method that enables the photosensitive material film to be stably exposed to light without the unexposed part due to insufficient focal depth.

A method for manufacturing a semiconductor device according to a third aspect of the invention includes performing patterning with use of the holographic exposure method according to the second aspect of the invention.

According to this method, the holographic exposure method that enables the film to be stably exposed to light is used, and therefore it is possible to manufacture a semiconductor device having a stable pattern shape and stable operation quality on a substrate.

A method for manufacturing an electro-optic device according to a fourth aspect of the invention is a manufacturing method of an electro-optic device having a thin film element.

The method forms a thin film element with use of the foregoing method for manufacturing a semiconductor device according to the third aspect of the invention.

According to this method, a thin film element is formed using a semiconductor device manufacturing method that enables a semiconductor device having a stable pattern shape and stable operation quality to be manufactured on a substrate, and therefore it is possible to manufacture an electro-optic device having stable quality.

BRIEF DESCRIPTION OF THE DRAWINGS

The invention will be described with reference to the accompanying drawings, wherein like numbers reference like elements.

DESCRIPTION OF EXEMPLARY EMBODIMENT

An embodiment of the invention will be described.

Initially, controversial points of the holographic exposure technique of related art will be described.

Figure 10:
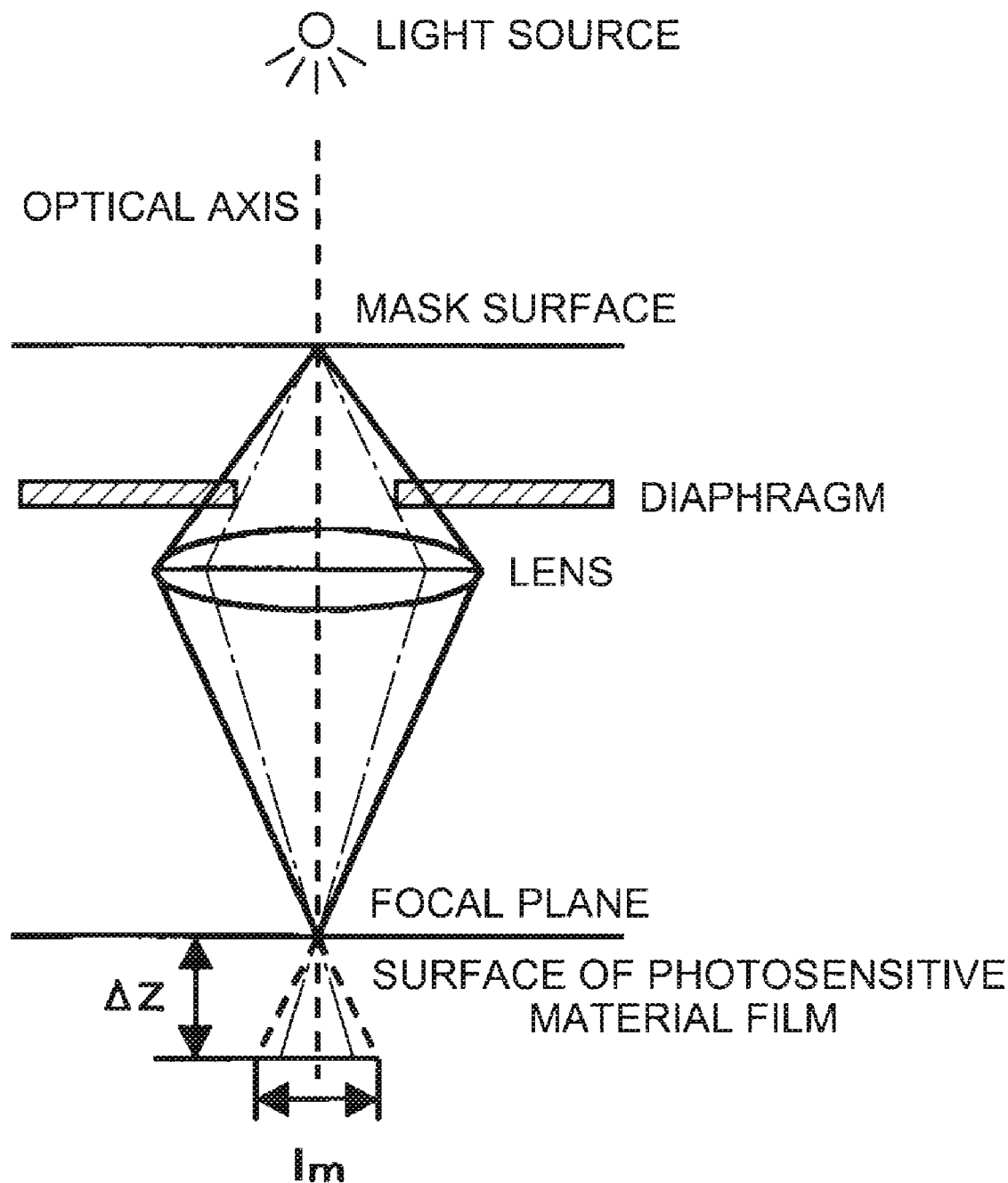
FIG. 10 is a diagram for illustrating the outline of the resolution (lm) and the focal depth ($\Delta Z$) in a projection optical system of related art.

FIG. 10 is a diagram for illustrating the outline of the resolution (lm) and the focal depth ($\Delta Z$) in a projection optical system of related art.

In general, the resolution (lm) of the projection exposure optical system, which is the minimum line width with which a pattern can be formed, is given by the following equation:

$$lm = k \cdot (\lambda / NA)$$

where k is a coefficient ranging from 0.6 to 0.7, $\lambda$ is the wavelength of light, and NA is the numerical aperture (brightness) of a lens used in the optical system.

As shown in FIG. 10, in the projection optical system of related art, a diaphragm is provided on the optical axis on the side where the exposure light from a light source is incident on a lens through a mask so as to narrow down the flux of the incident light, thereby reducing the numerical aperture.

In this case, since the focal depth ($\Delta Z$) is given by the following equation: $\Delta Z \approx \pm \lambda / 2(NA)^2$, the smaller NA is, the larger the focal depth will be.

Thus, providing a diaphragm enables the focal depth to be adjusted.

However, in the holographic exposure, exposure is performed in principle without use of a lens.

The numerical aperture (NA) mentioned above is therefore determined by the positional relation between the holographic mask and the substrate to be exposed, not by the characteristics of the lens used.

If the gap between the holographic mask and the substrate to be exposed is approximately 100 μm, the NA is approximately 0.8.

This value means that a simple optical system (prism+ holographic mask) can realize resolution equivalent to that provided by a stepper with a complex optical system composed of a large number of lenses.

On the other hand, the larger NA is, the smaller the focal depth ($\Delta Z$) is.

Accordingly, the holographic exposure technique of related art has features of higher resolution and smaller focal depth than those in the normal mask exposure.

As a result of smaller focal depth, in the case where light exposure is performed with a desired resolution, the area in the thickness direction of a photosensitive material film where a sufficient amount of light energy for the light exposure can be provided becomes smaller.

Consequently, if the substrate to be exposed has a pattern formed in advance thereon and has the surface having unevenness, a desired light exposure cannot be completed by one-time exposure.

There arises a need to perform exposure a plurality of times (multiple exposure) with the focus position being shifted in the thickness direction of a photosensitive material film.

Original Reticle and Holographic Mask

An original reticle and a holographic mask will be described.

Figure 1A:
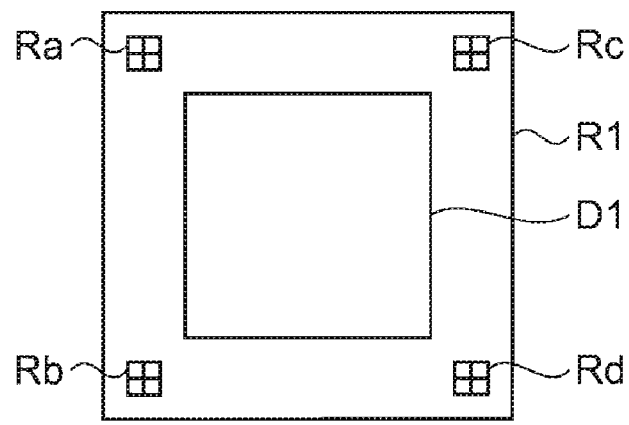
FIG. 1A is a plan view of an original reticle.
Figure 1B:
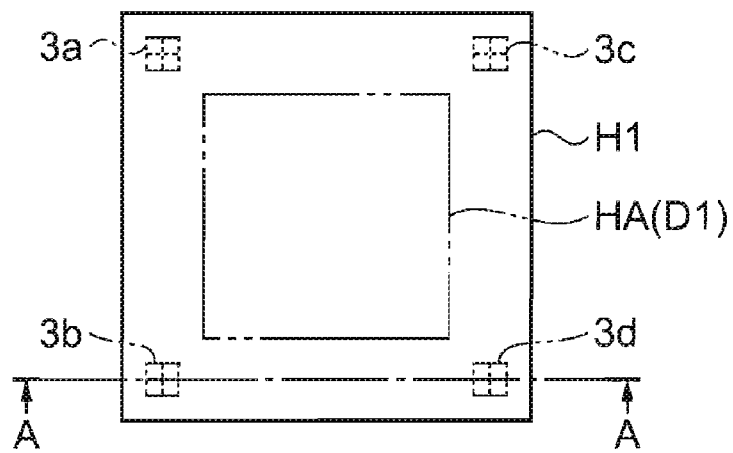
FIG. 1B is a plan view of a holographic mask.
Figure 1C:
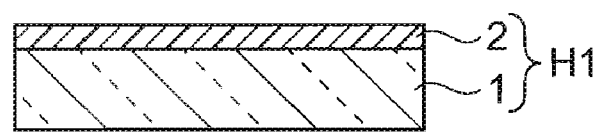
FIG. 1C is a sectional view taken along the line A-A in FIG. 1B.

FIGS. 1A to 1C are schematic diagrams showing an original reticle and a holographic mask.

In detail, FIG. 1A is a plan view of an original reticle; FIG. 1B is a plan view of a holographic mask; and FIG. 1C is a sectional view taken along the line A-A in FIG. 1B.

As shown in FIG. 1A, a reticle R1 as the original reticle includes an exposure area D1 where an exposure pattern for forming a device on a substrate made of transparent quartz glass or the like is provided, and four cruciform reticle alignment marks Ra, Rb, Re and Rd that are placed on the periphery of the exposure area D1 and at four corners of the substrate.

The exposure pattern and the reticle alignment marks Ra, Rb, Rc and Rd are made by depositing chrome (Cr) as a metal material to a thickness of about 100 nm on the substrate, and patterning it using photolithography.

As shown in FIGS. 1B and 1C, a holographic mask H1 includes a substrate 1 made of transparent quartz glass and a recording layer 2 in which a pattern can be holographically recorded.

The recording layer 2 includes a holographic exposure area HA in which a pattern is holographically recorded using a recording method to be described later, and four alignment marks 3a, 3b, 3c and 3d.

In the exposure area HA, an exposure pattern of the exposure area D1 of the reticle R1 is holographically recorded as an interference pattern.

The alignment marks 3a, 3b, 3c and 3d are also holographically recorded and therefore are invisible under visible light.

In this case, although the alignment marks 3a, 3b, 3c and 3d are not visualized, the holographic mask H1 is used for the first exposure, raising no problem in accuracy of alignment with the substrate to be exposed.

Holographic Recording Device

A holographic recording device used for holographic recording will be described.

Figure 2:
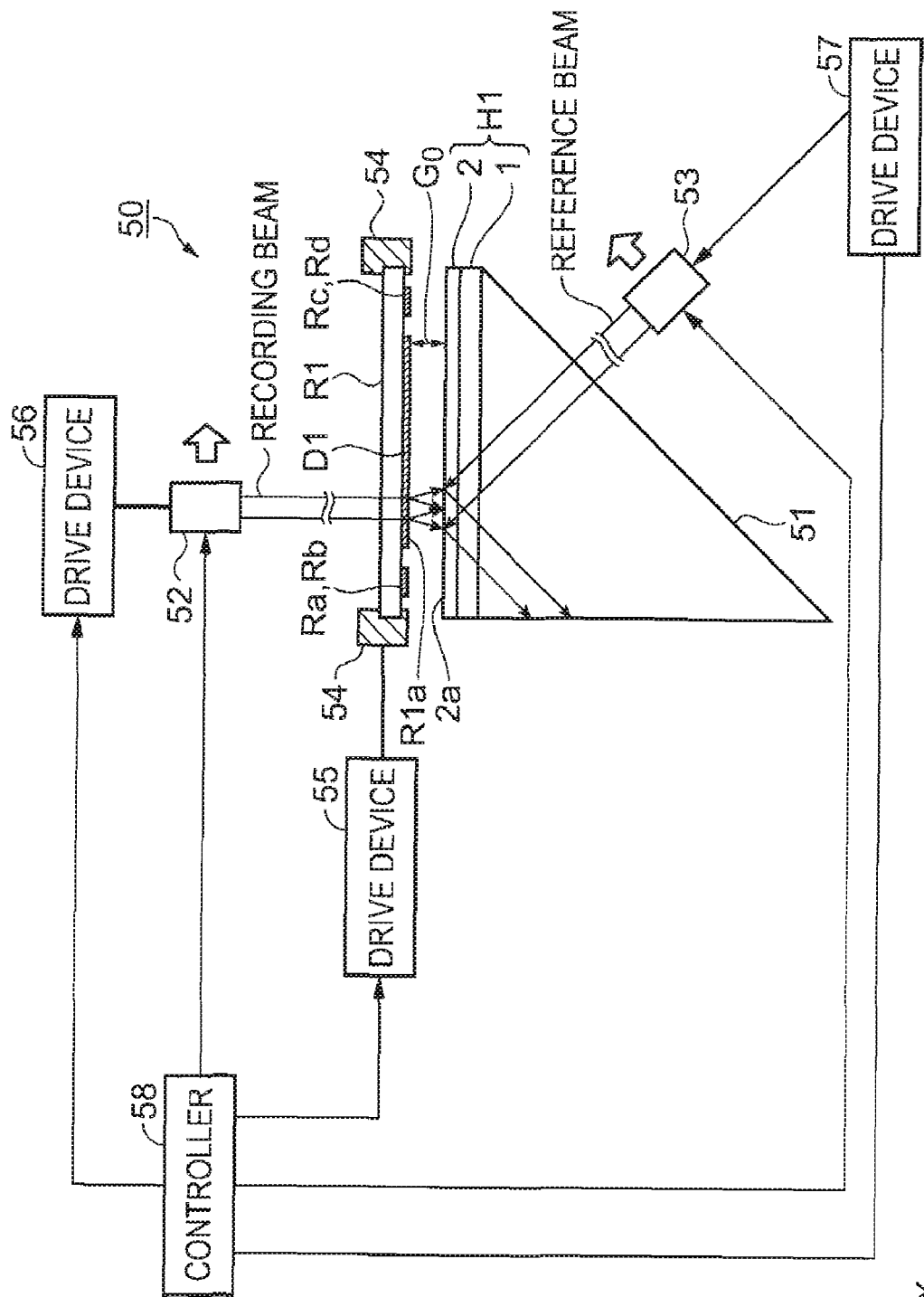
FIG. 2 is a schematic diagram showing the configuration of a holographic recording device.

FIG. 2 is a schematic diagram showing the configuration of a holographic recording device.

As shown in FIG. 2, a holographic recording device 50 includes a prism 51 on which the holographic mask H1 is mounted, an exposure light source 52 that can emit a recording beam as recording light, an exposure light source 53 that can emit a reference beam as reference light, and a mask support 54 that places the reticle R1 such that the reticle R1 is opposite to the holographic mask H1 mounted on the prism 51 with a desired gap provided therebetween.

Further, the holographic recording device 50 includes a drive device 55 that can move the mask support 54 in X, Y and Z directions, a drive device 56 that can move the exposure light source 52 in a direction parallel to the reticle R1, and a drive device 57 that can move the exposure light source 53 in a direction parallel to the hypotenuse face of the prism 51.

Components constituting the holographic recording device 50 are controlled by a controller 58, which is made of an information-processing device such as a personal computer or the like.

The controller 58 drives the drive device 55 to relatively move the mask support 54 with respect to the holographic mask H1, permitting the reticle R1 and the holographic mask H1 to be aligned at predetermined positions.

The controller 58 also controls the drive devices 56 and 57 to move the exposure light sources 52 and 53, respectively, such that the recording beam and the reference beam are applied in synchronization with each other to the recording layer 2 of the holographic mask H1.

Further, the controller 58 performs control so that the recording beam and the reference beam are emitted with predetermined intensities from the exposure light sources 52 and 53, respectively.

Two exposure light sources 52 and 53 each can use, for example, an argon (Ar) ion laser with a wavelength of 364 nm.

The exposure light sources 52 and 53 emit laser beams so as to synchronize the recording beam and the reference beam each having a beam diameter of approximately 10 mm.

In addition, the laser beam emitted from one exposure light source may be split into the recording beam and the reference beam.

Holographic Exposure Method

A holographic exposure method including a recording method of the present embodiment will be described with reference to FIGS. 2 to 8B.

Figure 3:
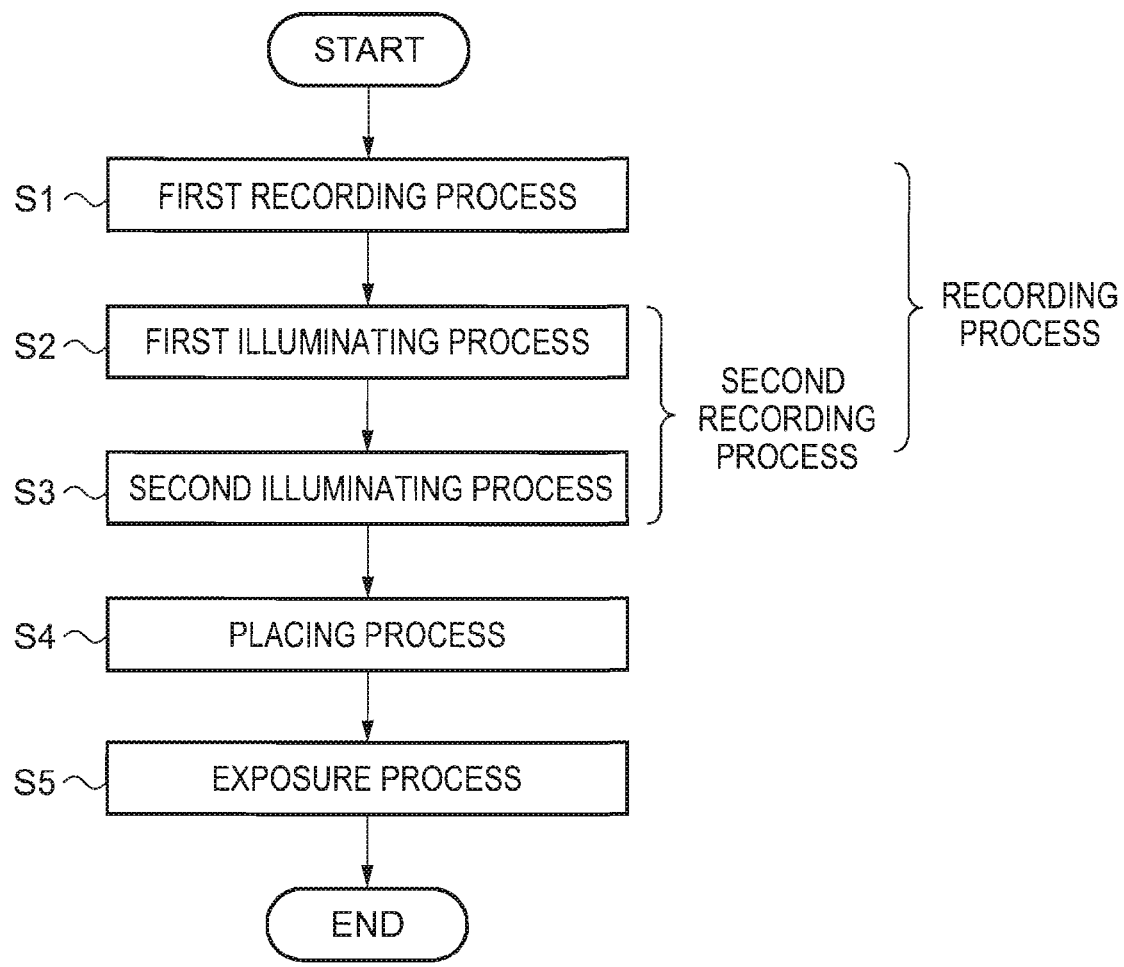
FIG. 3 is a flow chart showing a holographic exposure method.
Figure 4A:
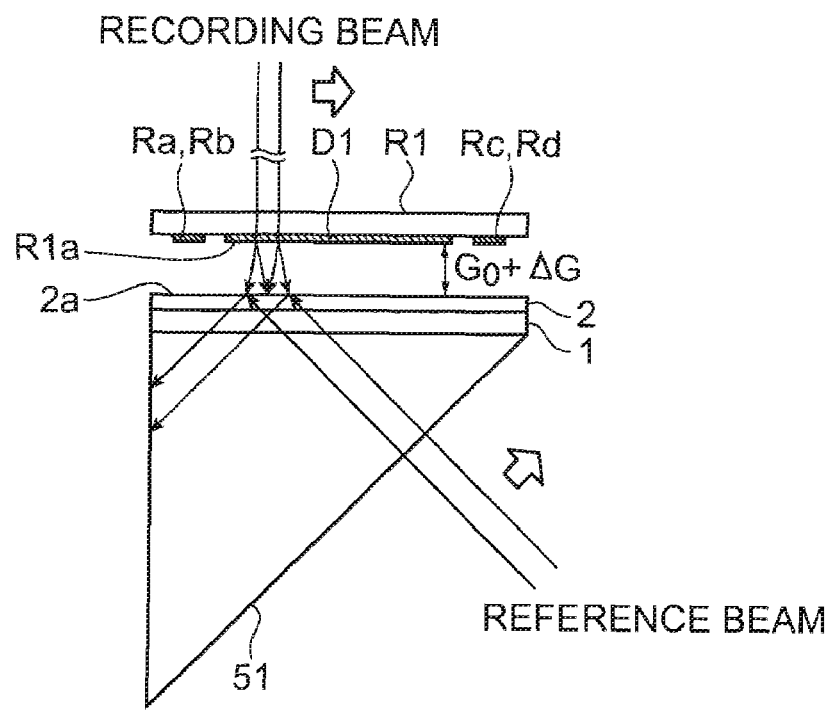
FIGS. 4A and 4B are schematic diagrams showing a recording method.
Figure 4B:
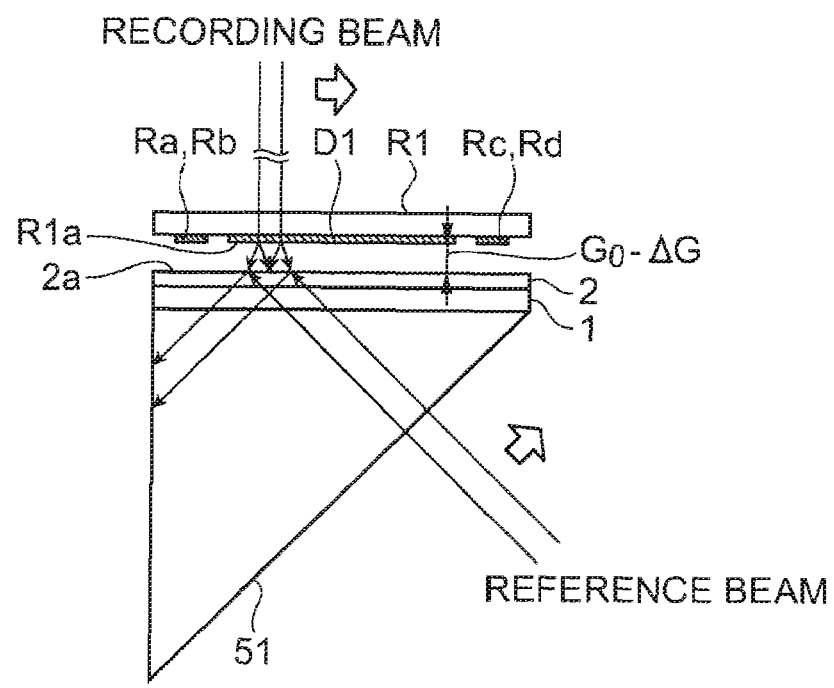

FIG. 3 is a flow chart showing the holographic exposure method, and FIGS. 4A and 4B are schematic diagrams showing the recording method.

Figure 5:
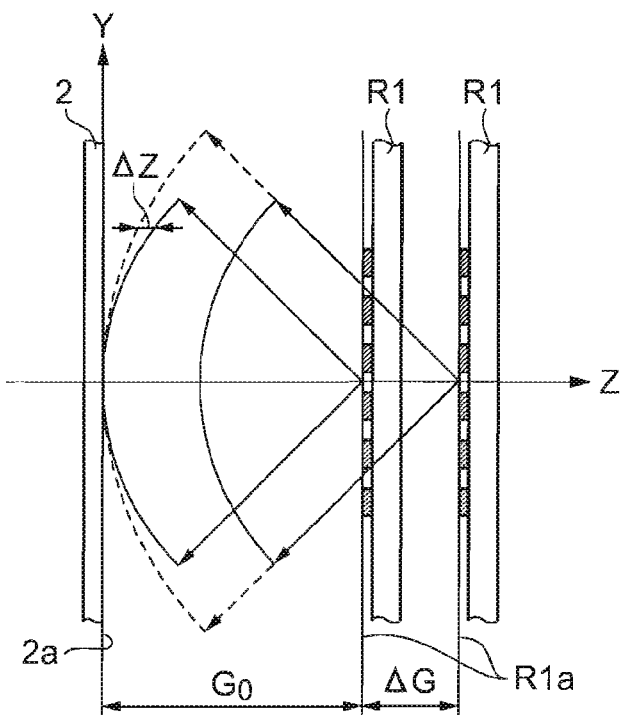
FIG. 5 is a schematic diagram showing object wavefronts in multiple recording.
Figure 6:
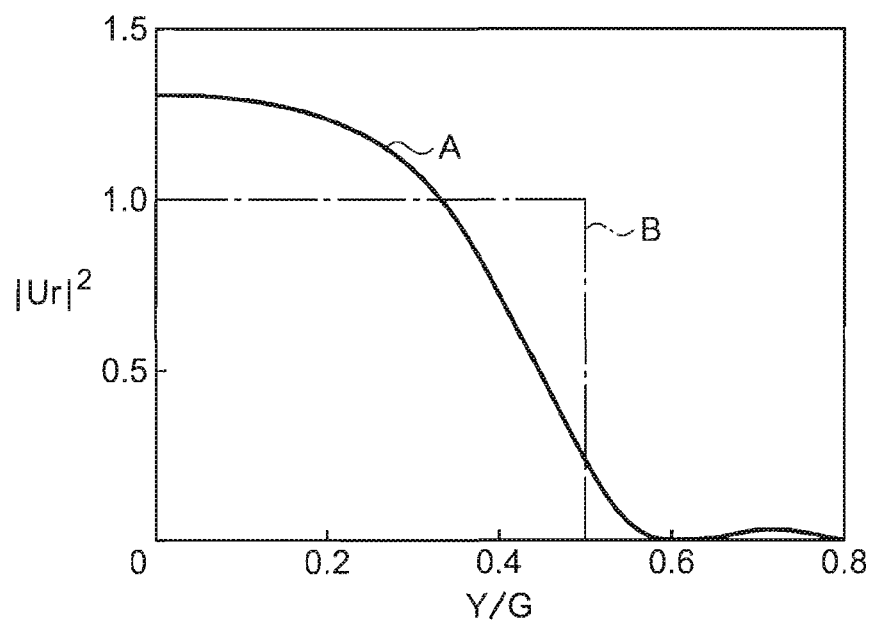
FIG. 6 is a graph showing intensity distribution of a reconstruction combined wave.

FIG. 5 is a schematic diagram showing object wavefronts in multiple recording, and FIG. 6 is a graph showing intensity distribution of a reconstruction combined wave.

Figure 7:
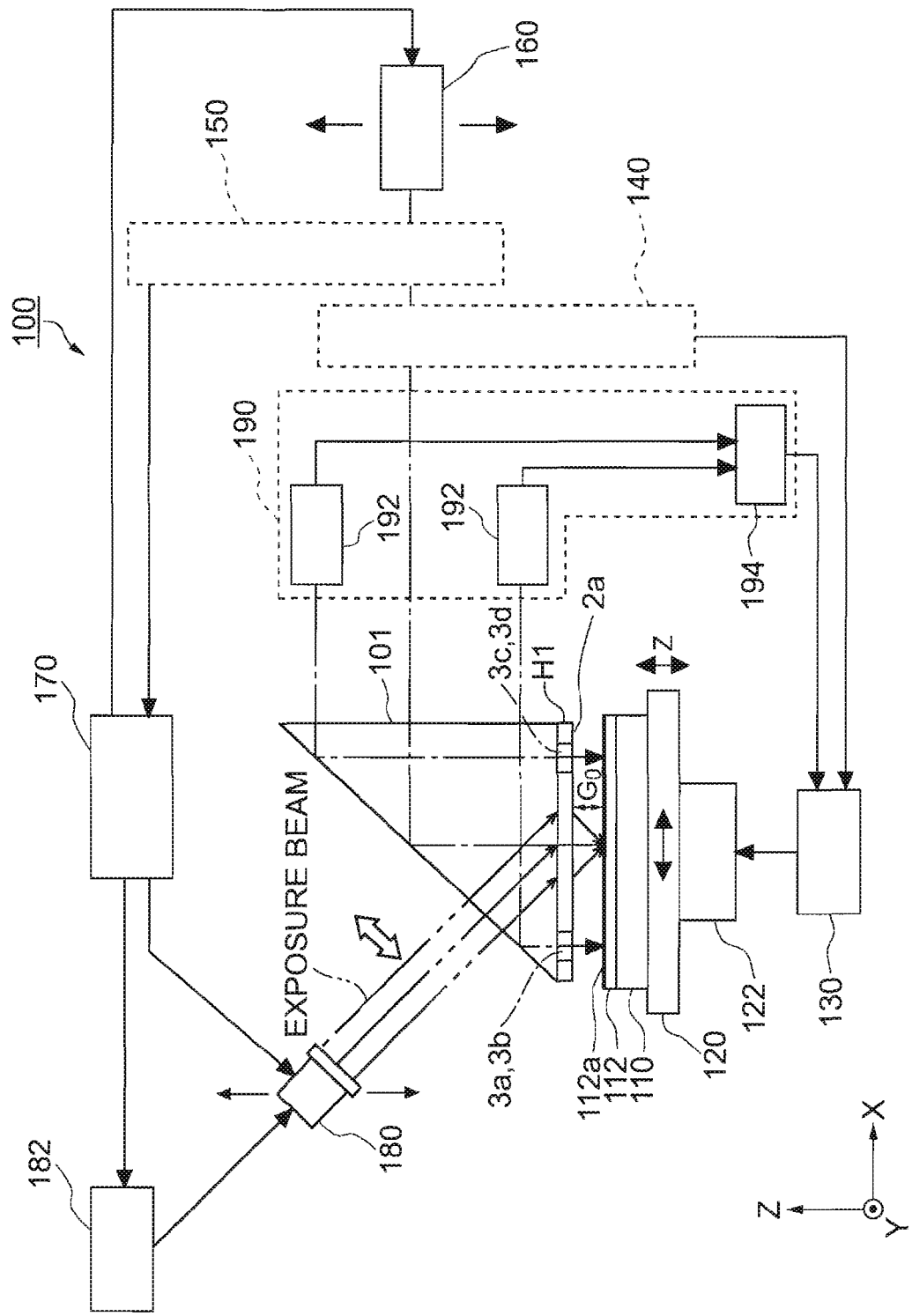
FIG. 7 is a schematic diagram showing the configuration of a hologram exposure device.
Figure 8A:
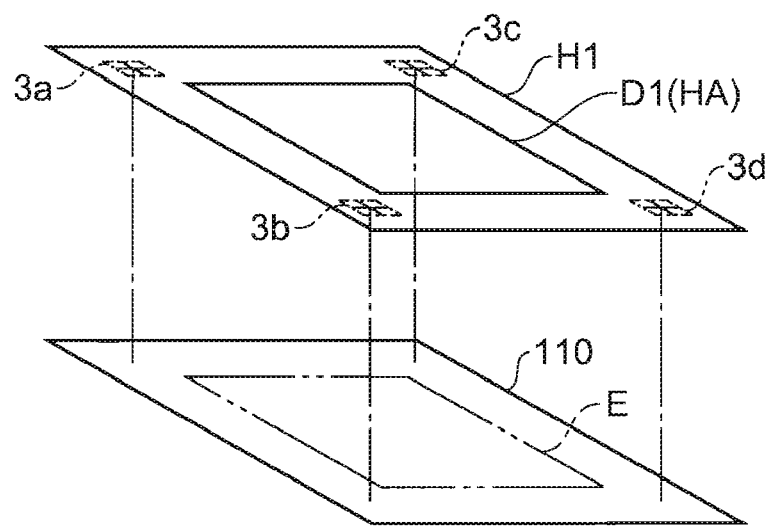
FIGS. 8A and 8B are schematic diagrams showing an exposure process.
Figure 8B:
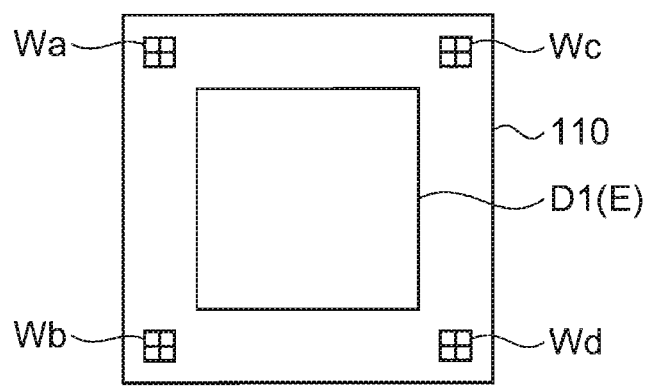

FIG. 7 is a schematic diagram showing the configuration of a holographic exposure device, and FIGS. 8A and 8B are schematic diagrams showing an exposure process.

A holographic exposure method of the embodiment includes a first recording process (step S1) in which, with the reticle R1 and the holographic mask H1 placed opposite to each other with a predetermined gap $G_0$ provided therebetween, the recording layer 2 is illuminated with a recording beam through the reticle R1 and is simultaneously illuminated with a reference beam at a predetermined incident angle from the side of the holographic mask H1; and a second recording process in which, with the reticle R1 and the holographic mask H1 placed opposite to each other with a gap different from the predetermined gap $G_0$, the recording layer 2 is illuminated with recording light through the reticle R1 and is simultaneously illuminated with a reference beam at the predetermined incident angle from the side of the holographic mask H1.

The second recording process includes a first illuminating process (step S2) in which, with the gap between the reticle R1 and the holographic mask H1 offset by a certain distance in such a direction that the gap expands relative to the predetermined gap $G_0$, the recording layer 2 is illuminated wit the recording beam and the reference beam simultaneously; and a second illuminating process (step S3) in which, with the gap offset by a certain distance in such a direction that the gap narrows relative to the predetermined gap $G_0$, the recording layer 2 is illuminated simultaneously with the recording beam and the reference beam.

The second recording process performs each of the first and second illuminating processes at least one time.

That is, steps S1 to S3 are recording processes.

The method further includes a placing process (step S4) for placing the holographic mask H1 and a substrate 110 opposite to each other such that the gap between the recording layer 2 and a surface 112a of the photosensitive material film 112 equals the predetermined gap $G_0$ with which exposure light is brought to focus on the photosensitive material film 112; and an exposure process (step S5) for illuminating exposure light through the holographic mask H1 so as to scan an exposure area of the photosensitive material film 112 (see FIG. 7).

Shown by step S1 in FIG. 3 is the first recording process.

In step S1, as shown in FIG. 2, the reticle R1 is set in the mask support 54 to be placed opposite to the holographic mask H1 held by the prism 51.

The controller 58 drives the drive device 55 to move the mask support 54 so that the predetermined gap $G_0$ is provided between a surface R1a of the reticle R1 and a surface 2a of the recording layer 2.

While a recording beam is being emitted from the exposure light source 52 toward the reticle R1, the drive device 56 is driven to move the exposure light source 52 in a direction parallel to the reticle R1 so that the recording beam scans the exposure area D1.

In synchronization with this, while a reference beam is being emitted from the exposure light source 53, the drive device 57 is driven to move the exposure light source 53 in a direction parallel to the hypotenuse face of the prism 51.

The recording beam is diffracted by an exposure pattern formed in the exposure area D1 of the reticle R1.

This diffracted light interfere with the reference beam that has been incident through the prism 51 at a predetermined angle, recording an interference pattern in the recording layer 2.

In this case, the predetermined gap $G_0$ is approximately 100 μm.

Then, the process proceeds to step S2.

Shown by step S2 in FIG. 3 is the first illuminating process of the second recording process.

In step S2, as shown in FIG. 4A, with the gap between the surface R1a of the reticle R1 and the surface 2a of the recording layer 2 offset by a predetermined distance ΔG in such a direction that the gap expands relative to the predetermined gap $G_0$, a recording beam and a reference beam are emitted in the same way as in the first recording process (step S1).

Then, the process proceeds to step S3.

Shown by step S3 in FIG. 3 is the second illuminating process of the second recording process.

In step S3, as shown in FIG. 4B, with the gap between the surface R1a of the reticle R1 and the surface 2a of the recording layer 2 offset by a predetermined distance ΔG in such a direction that the gap narrows relative to the predetermined gap $G_0$, a recording beam and a reference beam are emitted in the same way as in the first recording process (step S1).

Then, the process proceeds to step S4.

In the recording processes of steps S1 to S3, the exposure pattern of the reticle R1 is multiply recorded as the interference pattern in the recording layer 2 of the holographic mask by performing holographic recording three times in total.

Here, the principles in the recording method of the embodiment will be described.

As shown in FIG. 5, the gap between the reticle R1 and the holographic mask H1 is set as the predetermined gap $G_0$ in the first recording process (step S1).

The recording beam is an object wave (spherical wave) $U_0$ that is diffracted by the exposure pattern.

In the first illuminating process of the second recording process, the gap is offset by $+\Delta G$ relative to the predetermined gap $G_0$, and the object wave at this point is set to be $U_+$.

An optical path difference $\Delta Z$ between $U_+$ and $U_0$ in the optical axis direction (Z-axis direction) can be derived from the following equation:

$$\Delta Z = \Delta G - (\Delta G/2)(Y/G_0)^2 \quad (1)$$

where Y is the maximum value in the Y direction of the recording layer 2 through which the object wave can pass when the predetermined gap $G_0$ is set.

From Eq. (1), the object wave $U_+$ when the gap is offset by $+\Delta G$ is expressed by the following equation:

$$U_+ = U_0 \exp(ik\Delta Z) \quad (2)$$

where i is an imaginary, k is a wave number of $2\pi/\lambda$, and $\lambda$ is a wavelength of the recording beam.

Likewise from Eq. (1), the object wave $U_-$ when the gap is offset by $-\Delta G$ is expressed by the following equation:

$$U_- = U_0 \exp(-ik\Delta Z) \quad (3)$$

Therefore, when holographic exposure is performed using the holographic mask H1 in which a pattern has been multiply recorded by the first and second recording processes, a reconstruction combined wave $U_r$ is expressed by the following equation:

$$\begin{aligned} Ur &= U_0 + U_+ + U_- \\ &= U_0 + U_0 \exp(ik\Delta Z) + U_0 \exp(-ik\Delta Z) \\ &= U_0 + 2U_0 \cos(k\Delta Z) \end{aligned} \quad (4)$$

Using the reconstruction combined wave Ur of Eq. (4), reduction of the NA (the maximum $Y/G_0$ with which the object wave can be recorded/reconstructed) of a hologram optical system is derived.

When approximated as Fourier function, the reconstruction combined wave Ur is expressed as the following equation.

$$Ur = A_0(0.5 + (2/\pi)\cos(k\Delta Z)) \quad (5)$$

where $A_0$ is a constant.

In Eq. (5), $\Delta G$ is set to be $2\lambda$ so that the phase of the reconstruction combined wave Ur is not reversed to the reconstruction wave $U_0$ on the optical axis.

The resulting equation is as follows:

$$Ur = A_0(0.5 + (2/\pi)\cos(2\pi(Y/G_0)^2)) \quad (6)$$

The condition for Ur being the maximum value of $0.5 A_0$ is that the phase $2\pi (Y/G_0)^2$ of the cos term is $\pi/2$, from which it follows that $(Y/G_0)^2 = (1/2)^2$ and $Y/G_0 = 0.5 = NA$.

Thus, it is found that Eq. (6) is equal to the reconstruction wave output from an image optical system (lens optical system) in which the NA is reduced from the inherent value (~0.8) to 0.5.

As described above, the exposure pattern of the reticle R1 is multiply recorded in the recording layer 2 of the holographic mask H1 as the interference pattern, allowing adjustment of the numerical aperture during holographic exposure.

That is, the focal depth can be adjusted in accordance with the resolution of the exposure pattern.

Note that, in this case, the same effects can be obtained by performing the first and second recording processes with $\Delta G$ offset as $n\lambda$.

Here, n is a natural number greater than or equal to 1.

If the distance between the reticle R1 and the holographic mask H1 is exceedingly apart from that of the predetermined gap $G_0$, the light intensity during recording decreases, so that the formed image is likely to be blurred, whereas if the distance is exceedingly close to that of the gap, the image is likely to be affected by errors in alignment accuracy.

Therefore, $\Delta G$ is preferably $2\lambda$.

Here, a holographic exposure device will be described.

As shown in FIG. 7, a holographic exposure device 100 mainly includes a prism 101, a stage device 122 with a stage 120, a first information processor 130, a distance measurement optical system 140, a film thickness measurement optical system 150, a light source 160, a second information processor 170, an exposure light source 180, an exposure light source drive device 182 and an alignment optical system 190.

The stage device 122 holds the substrate 110, on which the photosensitive material film 112 is formed and which is to be exposed to light, on the stage 120 with a vacuum chuck or the like such that the position of the stage 120 can be adjusted in the vertical direction (Z direction) and the horizontal direction (X-Y direction).

The light source 160 can emit a light beam for measurement of the distance measurement optical system 140 and the film thickness measurement optical system 150.

The distance measurement optical system 140 includes a beam splitter, a cylindrical lens, an optical sensor, an error signal detector and the like such that the focus during exposure can be controlled by adjusting the distance between the surface 2a of the recording layer 2 of the holographic mask H1 (hereinafter referred to as a "holographic recording surface") and the surface 112a of the photosensitive material film 112 applied on the substrate 110 (hereinafter referred to as a "photosensitive material film surface").

The first information processor 130 sets the position of the stage 120 on the basis of the distance between the holographic recording surface 2a and the photosensitive material film surface 112a formed on the substrate 110, which is measured by the distance measurement optical system 140, so as to make the focus appropriate.

The film thickness measurement optical system 150 including a beam splitter, a photodetector, an amplifier, an analog-to-digital (A/D) converter and other components has a configuration to measure the film thickness of the photosensitive material film 112 formed on the substrate 110.

The second information processor 170 moves the exposure light source 180 so that scans of an exposure beam as exposure light emitted from the exposure light source 180 are performed within an appropriate exposure area, and controls the quantity of light for exposure based on the relative value of the film thickness of the photosensitive material film 112 output by the film thickness measurement optical system 150.

The exposure light source 180 is provided so that the holographic recording surface 2a of the holographic mask H1 can be illuminated with an exposure beam from the reverse direction to that of the beam during holographic recording.

The holographic exposure area HA of the holographic mask H1 can also be illuminated with an exposure beam (reconstruction wave) of the same wavelength, 364 nm, as that of the beam from the exposure light source 52 used for holographic recording.

That is, in this case, an Ar ion laser beam with a beam diameter of approximately 10 mm is emitted so as to scan the holographic exposure area HA of the holographic mask H1.

The exposure light source drive device 182 moves the exposure light source 180 so that a desired exposure area on the substrate 110 is scanned and exposed to light.

The holographic exposure device 100 includes the prism 101.

On the surface facing the substrate 110 of the prism 101 is firmly mounted the holographic mask H1 in which an interference pattern in accordance with a predetermined exposure pattern is recorded.

An alignment optical system 190 includes four microscopes 192 and an alignment error detector 194 that detects alignment errors between the alignment marks in the holographic mask and those on the substrate 110 based on image information obtained by the microscopes 192.

Each microscope 192 is provided, for example, in such a state as to be able to view each of the alignment marks formed on the substrate 110 through the holographic mask.

The microscope 192 includes an image capturing device such as a charge-coupled device (CCD) camera for capturing images of viewed alignment marks.

The image of each alignment mark viewed by the microscope 192 and captured by the image capturing device is converted to image signals, which are sent to the alignment error detector 194.

The alignment error detector 194 extracts characteristic points of the alignment mark, and calculates the distance between the characteristic points.

In this case, for example, an intersection point of alignment marks of the substrate 110 and an intersection point of alignment marks of the holographic mask are extracted as the characteristics points, and the distance between the intersection points is calculated.

Information on this calculated distance is sent to the first information processor 130. The first information processor 130 moves the stage 120 in the X-axis and Y-axis directions to set the position of the substrate 110 so as to decrease the misalignment amount of the distance between the intersection points.

This enables alignment between the holographic mask and the substrate 110 in multiple exposure. In the embodiment, since the case of performing the first holographic exposure is taken as an example, alignment with high accuracy is not demanded.

Step S4 in FIG. 3 is a placing process.

In step S4, the substrate 110 on which the photosensitive material film 112 to be exposed is formed is set on the stage 120, as shown in FIG. 7.

The first information processor 130 drives the stage device 122 to move the stage 120 so that the gap between the holographic recording surface 2a of the holographic mask H1 held by the prism 101 and the photosensitive material film surface 112a is the predetermined gap $G_0$ that is the same as during holographic recording. Then, the process proceeds to step S5.

Step S5 in FIG. 5 is an exposure process.

In step S5, as shown in FIG. 7, the second information processor 170 makes the exposure light source 180 emit an exposure beam, while driving the exposure light source drive device 182 to move the exposure light source 180 in a direction parallel to the hypotenuse face of the prism 101, so that the exposure beam scans the holographic mask H1.

In the recording layer 2 of the holographic mask H1, the exposure pattern of the reticle R1 is multiply recorded in the previous recording process.

The exposure beam is of the same wavelength as that of the reference beam during holographic recording, and illuminates the recording layer 2 from the reverse direction to the incident direction of the reference beam.

As a result, a reconstruction combined wave of high-order diffracted wave arises from the recording layer 2 towards the photosensitive material film surface 112a.

As shown in FIG. 6, a reconstruction combined wave A is close to a rectangle wave B where exposure light is in the ideal state, and the numerical aperture (NA) is substantially equal to that of the lens optical system, that is, 0.5 by attenuation of the amplitude (light intensity).

By the reconstruction combined wave A, the exposure pattern of the reticle R1 is printed on the photosensitive material film 112.

In the reconstruction combined wave A, the focal depth increases although the resolution decreases.

Therefore, if the photosensitive material film surface 112a has unevenness, the exposure pattern can be printed by performing exposure one time, without performing exposure a plurality of times in accordance with the unevenness.

Thus, as shown in FIG. 8A, the exposure pattern recorded in the exposure area D1 of the holographic mask H1 and the alignment marks 3a, 3b, 3c and 3d are printed on the substrate 110.

On the substrate 110 after exposure, as shown in FIG. 8B, the exposure area D1 of the holographic mask H1 is reconstructed in an exposure area E of the substrate 110, and the alignment marks 3a, 3b, 3c and 3d are reconstructed as alignment marks Wa, Wb, Wc and Wd at the four corners.

Semiconductor Device Manufacturing Method

A method for manufacturing a semiconductor device of the embodiment uses the reticle R1 having in its exposure area D1 an exposure pattern for forming a semiconductor layer, an insulating layer, a conductor layer and the like of a semiconductor device.

The method includes, according to the holographic exposure method of the above-described embodiment, a recording process where the exposure pattern of the reticle R1 is multiply recorded in the recording layer 2 of the holographic mask H1, and an exposure process where a semiconductor wafer or a substrate with the photosensitive material film 112 formed thereon and the holographic mask H1 are placed to be opposite with the predetermined gap $G_0$ provided therebetween and are illuminated with an exposure beam.

Further, the method develops the exposed photosensitive material film 112, and includes publicly known processes such as etching and ion implantation.

Thus, it is possible to manufacture a semiconductor device having a stable pattern shape.

Electro-Optic Device Manufacturing Method

Figure 9:
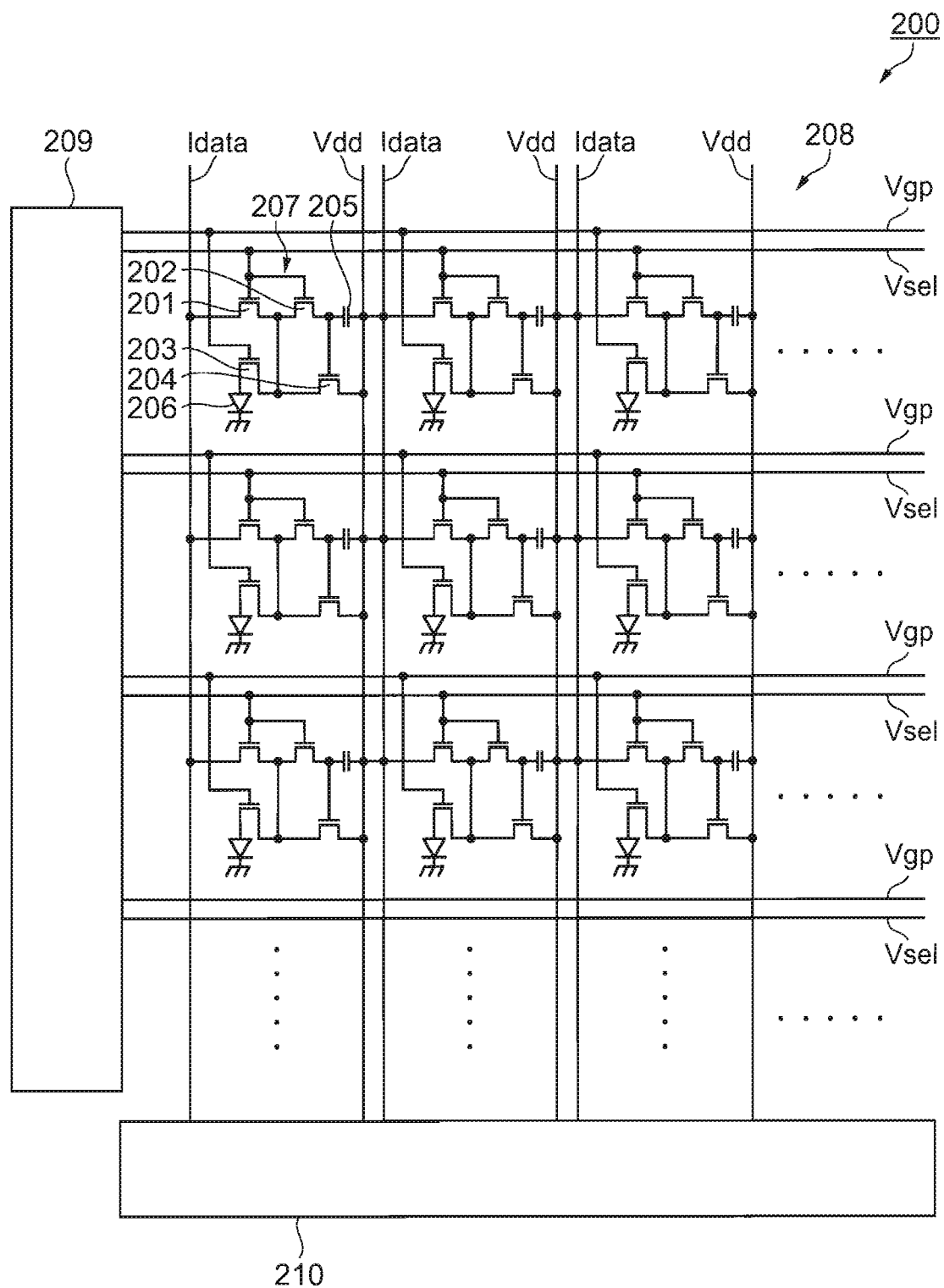
FIG. 9 is a circuit diagram showing the electrical configuration of an electro-optic device.

A method for manufacturing an electro-optic device of the embodiment will be described. FIG. 9 is a circuit diagram showing the electrical configuration of an electro-optic device.

As shown in FIG. 9, an electro-optic device 200 includes a circuit board (active matrix board) in which pixel circuits 207 each having four thin film transistors 201, 202, 203 and 204 as thin film elements, a capacitor 205 and a light-emitting element 206 are placed in matrix in a pixel region 208 on the substrate; and drivers 209 and 210 supplying drive signals to the pixel circuits 207.

The driver 209 supplies drive signals through scanning lines Vsel and light-emitting control lines Vgp to pixel regions 208.

The driver 210 supplies drive signals through the data lines Idata and the power source lines Vdd to pixel regions 208.

By controlling the scanning line Vsel and the data line Idata, a current program for each pixel region 208 is performed, allowing light-emitting by the light-emitting element 206 to be controlled.

The thin film transistors 201, 202, 203 and 204 constituting the pixel circuit 207 and thin film transistors as thin film elements constituting the drivers 209 and 210 are formed by applying a semiconductor device manufacturing method that uses the above-described holographic exposure method of the embodiment.

Therefore, it is possible to manufacture the electro-optic device 200 that has thin film transistors with stable element shapes and by which stable drive can be obtained.

Note that descriptions have been made for the manufacturing method of the electro-optic device 200 as an example of the electro-optic device manufacturing method, but the above holographic exposure method of the embodiment can also be similarly applied to manufacturing methods of other various electro-optic devices such as liquid crystal displays.

Effects of the above-described embodiment are as follows.

(1) In the holographic exposure method of the above embodiment, regarding the recording process for holographically recording the exposure pattern of the reticle R1 in the recording layer 2 of the holographic mask H1, holographic recording is performed three times in total with the gap between the reticle R1 and the holographic recording surface 2a set as the predetermined gap $G_0$ in the first recording process, and $\pm \Delta G$ offset relative to the predetermined gap $G_0$ in the second recording process.

Therefore, the exposure pattern is recorded as the interference pattern three times in the recording layer 2.

If the exposure process is performed by using this holographic mask H1 in which the pattern is multiply recorded, high-order diffracted wave arises, so that exposure can be performed by using the reconstruction combined wave Ur where the diffracted waves mutually interfere.

Consequently, by appropriately setting $\Delta G$, the numerical aperture of the reconstruction combined wave Ur is changed to adjust the focal depth, allowing exposure to be performed.

(2) In the holographic exposure method of the above embodiment, by setting $\Delta G$ to be $n\lambda$, preferably $2\lambda$, holographic exposure can be performed by controlling the numerical aperture in the state where attenuation of the intensity of an optical image when the image is formed is the minimum without changing the phase on the optical axis.

Therefore, the focal depth is increased although the resolution decreases, allowing the exposure pattern of the reticle R1 to be stably reconstructed and printed by a single exposure, even though the photosensitive material film surface 112a has unevenness.

(3) Since the method for manufacturing a semiconductor device of the above embodiment uses the above holographic exposure method, a semiconductor device having a stable pattern shape can be manufactured.

(4) The method for manufacturing the electro-optic device 200 of the above embodiment forms the thin film transistors 201, 202, 203 and 204 and thin film transistors as thin film elements constituting the drivers 209 and 210.

Therefore, it is possible to manufacture the electro-optic device 200 that has thin film transistors with stable element shapes and by which stable drive can be obtained.

Although descriptions have been made in the above embodiment, it is to be understood that the present invention can be applied to various kinds of modifications without departing from the scope and spirit of the invention.

For example, modification examples other than the above embodiment are as follows.

(First Modification) In the holographic exposure method of the above embodiment, the holographic mask H1 is not limited to that used for the first exposure process.

The holographic exposure method can also be applied to, for example, a holographic mask that is used in the second exposure process and thereafter where a thin film layer is further deposited on the pattern of a semiconductor device or the like obtained by the first exposure process and a photolithography method is used to provide the thin film layer with a different pattern.

(Second Modification) In the holographic exposure method of the above embodiment, the number of times of holographic recording is not limited to three.

For example, holographic recording should be performed at least two times in the first recording process for holographic recording with the predetermined gap $G_0$ and in the exposure process for holographic recording with the gap offset by appropriately setting the value of $\Delta G$ so that the amplitude of the reconstruction combined wave Ur during the holographic exposure is attenuated.

(Third Modification) In the holographic exposure method of the above embodiment, the sequence of holographic recording is not limited to that of the first recording process and then the second recording process (first illuminating process and the second illuminating process).

Any sequences may be made as far as they allow multiple recording to be performed.

(Fourth Modification) The manufacturing method to which the holographic exposure method of the above embodiment can be applied is not limited to the manufacturing method of an electro-optic device.

The holographic exposure method can be applied to manufacturing various devices.

For example, the holographic exposure method can also be applied to manufacturing methods of various types of memory such as Ferroelectric RAM (FeRAM), static RAM (SRAM), dynamic RAM (DRAM), negative OR (NOR) type RAM, negative AND (NAND) type RAM, floating-gate type non-volatile memory and magnetic RAM; and manufacturing methods of inexpensive tags having a minute circuit chip (IC chip) mounted thereon in non-contact type communication systems using microwaves.

The entire disclosure of Japanese Patent Application No: 2006-101656, filed Apr. 3, 2006 is expressly incorporated by reference herein.

What is claimed is:

1. A method of recording an exposure pattern in a recording layer of a holographic mask, using an original reticle that has the exposure pattern formed therein, the recording method comprising:

illuminating a first recording light and a first reference light to the recording layer simultaneously, the first recording light being illuminated through an original reticle placed opposite to the holographic mask with a first gap therebetween, the first reference light being illuminated to the recording layer at a first incident angle; and illuminating a second recording light and a second reference light to the recording layer simultaneously, the second recording light being illuminated through the original reticle placed opposite to the holographic mask with a second gap therebetween, the second gap being different from the first gap, the second reference light being illuminated to the recording layer at a second incident angle.

2. The method of recording an exposure pattern according to claim 1, illuminating a third recording light and a third reference light to the recording layer simultaneously, the third recording light being illuminated through the original reticle placed opposite to the holographic mask with a third gap therebetween, the third gap being different from the first gap, the third reference light being illuminated to the recording layer at a third incident angle, the first gap being larger than the second gap, the first gap being smaller than the third gap.

3. The method of recording an exposure pattern according to claim 2, an absolute figure of a differential amount between the first and the second gaps being $n\lambda$, $\lambda$ being a wavelength of the recording light and n being a natural number that is not less than 1.

4. The method of recording an exposure pattern according to claim 1, the first and the second recording lights being the same, the first and the second reference lights being the same.

5. The method of recording an exposure pattern according to claim 1, the holographic mask being disposed on a first surface of a prism, the first and the second reference lights being illuminated from a second surface of the prism to the recording layer, the first and the second surfaces being different.

6. The method of recording an exposure pattern according to claim 1, the first and the second incident angles being the same.

7. A method of forming an exposure pattern in a photosensitive material film disposed a substrate, the method comprising:

illuminating a first recording light and a first reference light to a recording layer of a holographic mask simultaneously, the first recording light being illuminated through an original reticle placed opposite to the holographic mask with a first gap therebetween, the first reference light being illuminated to the recording layer at a first incident angle;

illuminating a second recording light and a second reference light to the recording layer simultaneously, the second recording light being illuminated through the original reticle placed opposite to the holographic mask with a second gap therebetween, the second gap being different from the first gap, the second reference light being illuminated to the recording layer at a second incident angle;

placing the holographic mask and the substrate opposite to each other; and illuminating an exposure light through the holographic mask to form the exposure pattern in the photosensitive material film.

8. The method of forming an exposure pattern according to claim 7, further comprising placing the holographic mask and the substrate opposite to each other such that a gap between the recording layer and a surface of the photosensitive material film is configured to be set in a range that is enough for the exposure light to focus on the photosensitive material film.

9. A method of manufacturing a semiconductor device, the method comprising:

performing patterning with use of the method according to claim 7.

10. A method of manufacturing an electro-optic device having a thin film element, the method comprising:

forming the thin film element with use of the method according to claim 9.

* * * * *